United States Patent
Sung

(10) Patent No.: US 6,235,592 B1
(45) Date of Patent: May 22, 2001

(54) TYPE OF HIGH DENSITY VERTICAL MASK ROM CELL

(75) Inventor: Kuan-Chou Sung, Taoyuan (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/400,177

(22) Filed: Sep. 21, 1999

(51) Int. Cl.[7] .................................. H01L 21/8236
(52) U.S. Cl. .................................. 438/278; 438/275
(58) Field of Search .................................. 438/275, 276, 438/277, 278, 279, 390, 227, 228, 229, 270, 239, 243, 246, 247, 248, 249, 587, 589

(56) References Cited

U.S. PATENT DOCUMENTS 5,904,526 * 5/1999 Wen et al. ............................ 438/275
5,937,280 * 8/1999 Wen ...................................... 438/130

* cited by examiner

Primary Examiner—David Nelms
Assistant Examiner—David Vu

(57) ABSTRACT

A method for forming a Trench Mask ROM cell comprises the steps of: Providing a substrate doped lightly with p-type dopant; forming plural trenches and then, forming a gate layer on each trench, further, implanting $n^+$-type ions on substrate beneath the gate oxide layer on bottom of each trench and position between each two adjacent trench; and then, forming a nitride layer on the gate oxide layer; forming an oxide layer on the nitride layer and each trench being filled with the oxide layer; and removing the oxide layer and the nitride layer of partial trenches, namely, partial trenches reserving the oxide and the nitride layer to define coding regions of the Trench Mask ROM cell; finally, depositing a polysilicon layer on the top surfaces of the substrate wherein the polysilicon being word line of the Trench Mask ROM cell.

19 Claims, 5 Drawing Sheets

TYPE OF HIGH DENSITY VERTICAL MASK ROM CELL

BACKGROUND OF INVENTION

1. Field of the Invention

The present invention generally relates to a method of fabrication of Mask ROM, and more precisely to a method of fabrication of new type of Trench Mask ROM.

2. Background of the Related Art

As the complexity and performance of ICs increase, more processing steps are needed to fabricate them. Four or five mask levels were quite adequate for primitive ICs in the 1970s, whereas 16-Mb (ultra large-scale integration or ULSI) memory chips require more than twenty mask levels. For bit densities of up to one megabit, planartype storage capacitors are used.

Read Only Memory is so named because its cells can read data only from the memory cells. The ROM can be distinguished as Mask ROM, PROM (Programmable ROM), EPROM (Erasable Programmable ROM) and EEPROM (Electrically Erasable Programmable ROM) depending on the particular method a ROM uses to store data. The Mask ROM is most fundamental ROM.

The fabrication of a typical planar type of Mask ROM is described as follows. The description of the process sequence for forming a planar type of Mask ROM is as shown in FIG. 1a to FIG. 1e. Referring first to FIG. 1a, a portion of the substrate 100 lightly with p-type dopant is shown. Furthermore, there are field-oxide areas 106 on both sides of the top portion of the substrate 100. A photo resist 104 is formed on the outer surface of the substrate 100 to define plural doped regions 102. The plural doped regions 102 are formed using an ion-implanting technique, wherein the plural doped regions 102 are implanted with $n^+$-type ion, such as As or P. The photo resist 104 is removed and the photo resist 104 is used to define the doped regions 102. Referring to FIG. 1b, after removing the photo resists 104 boron ions are implanted into the substrate to form cell isolation region 108. The cell isolation region 24 is used for suppressing the leakage. Referring to FIG. 1c, a gate oxide layer 110 is formed on the substrate 100 and the doped regions 102. And, a polysilicon layer 112 is formed sequentially on the gate oxide layer 110.

Referring to FIG. 1d, a photo mask 114 is used during a boron ion-implanting step, wherein the photo mask 114 is used to define a coding cell for forming a Mask ROM. Then, a Mask ROM is formed with some high-logic-level regions. As shown in FIG. 1e, there is a fixed threshold voltage between two adjacent doped regions 102. According to the doped regions 102 doped with $n^+$-type dopant and the doped regions 116 doped with boron ions will increase the threshold voltage. Namely, a higher threshold voltage relates to a high-logic-level. Conversely, a low-logic-level is one pair of two the adjacent doped regions 102 which contains an undoped region 118 between the two adjacent doped regions 102.

However, as component density has increased, the amount of charge need for a sufficient noise margin remains fixed. And, a device is composed of huge number of components. Further, a chip contains a lot of devices. As described above, the typical planar type of Mask ROM cannot satisfy the reduction of the device scale. Hence, it is difficult to compose a huge number of devices on a small chip. Furthermore, as the size of device is reduced the distance between two adjacent components is so close so as to cause the current leakage on the surface of the device. Hence, the current leakage and small-scale integration lead the fabrication of the mask ROM to be restricted. Therefore, in order to reduce leakage and cell size and to form large-scale integration, a new type of Trench Mask ROM cell is needed.

SUMMARY OF THE INVENTION

Accordingly, it is an object of the present invention to provide a new type of Trench Mask ROM cell and fabricating method for such a cell. The Trench Mask ROM cell can achieve purposes such as forming a large-scale integration and reducing current leakage and the size of device.

Briefly described, the present invention relates to a method for fabricating a Trench Mask ROM cell. An embodiment of the method comprises the following steps. For simplification, an example is used to describe the present invention. First, a p-well with p-type dopant on p-type substrate or n-type substrate is provided. A pad oxide layer and a first nitride layer are formed sequentially on the substrate. Plural trenches are formed using well-known etching techniques. After etching back the first nitride layer and the pad oxide layer, the plural trenches are formed on the substrate. Then, a gate oxide layer is formed on the surface of each trench by using either a thermal oxidation or a deposition technique. After the gate oxide layer is formed, the first nitride layer is removed. And, $n^+$-type ions are implanted into the substrate below the pad oxide layer between each of the two trenches and the gate oxide layer on the bottom of each trench. Such $n^+$-type ions are arsenic or phosphoric ions. A second nitride layer is formed on the outer surface on the substrate. Further, each trench is filled with oxide. After filling the oxide, the surfaces are etched and processed using chemical-mechanical polishing or etch back technique and stop on the nitride layer on the pad oxide. After that, a photo resist is formed to define a coding of the Trench Mask ROM. Namely, using the photo resist exposes some of the trenches. By using the etching technique, the filled-oxide and the nitride layer of the exposed trenches are removed. Sequentially, the photo resist is removed after the etching step. Finally, a polysilicon layer is formed on the nitride layer on the pad oxide layer, filled-oxide in the trenches and the gate oxide on the bottom of trenches. The polysilicon is patterned to define as word line of the Trench Mask ROM.

The Trench Mask ROM includes low-logic-level regions and high-logic-level regions. And, the low-logic-level regions are referred to as those regions having low threshold voltage. Conversely, the high-logic-level regions are referred to those regions having high threshold voltage. The threshold voltage between two adjacent stacks is depended on the depth and the conductivity of the trench between the two stacks. The threshold voltage is increased if the depth of the trench become deeper. Otherwise, the threshold voltage is increased gain if the trench is filled with oxide. And, the high threshold voltage and low threshold voltage are respectively to "off" state and "on" state. Thus, the Trench Mask ROM is coded.

By using these methods, the purposes of forming a large-scale integration, suppressing current leakage and reducing of the size of the device can be achieved.

DETAILED DESCRIPTION OF THE PREFERRED EMBODIMENT

The following detailed description relates to a method for forming a new type of trench mask ROM cell according to the present invention. A typically example is described as follows.

Figure 1A:
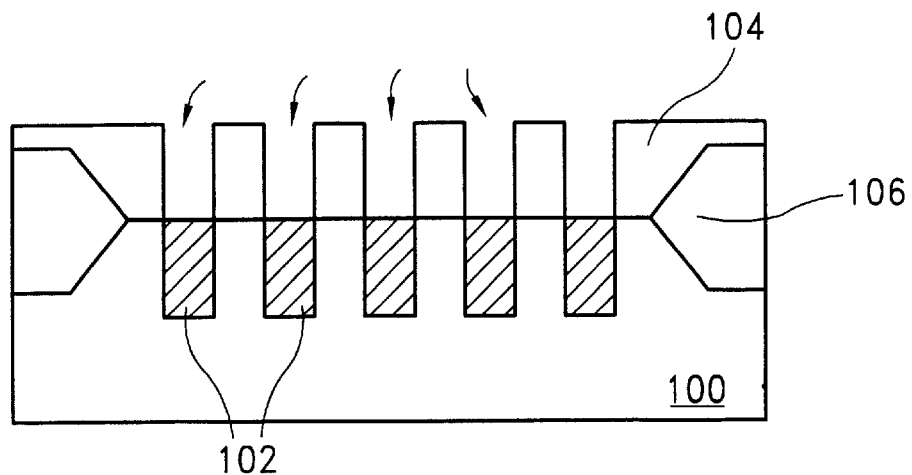
FIG. 1a shows the step of implanting As or P ions of the prior art.
Figure 1B:
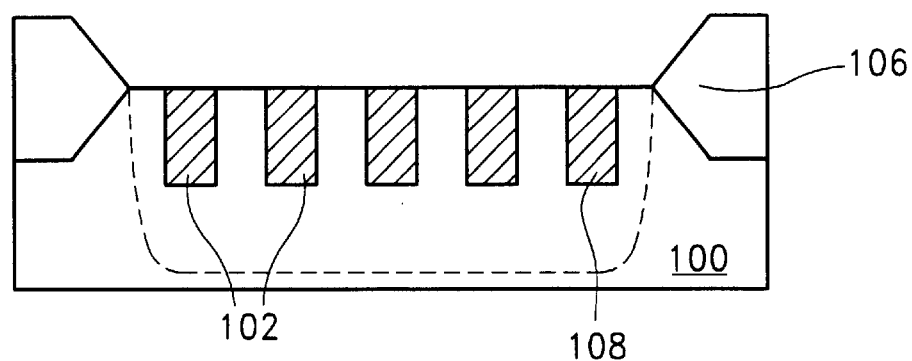
FIG. 1b shows the step of forming an isolation region by doping boron ions into a P-well of the prior art.
Figure 1C:
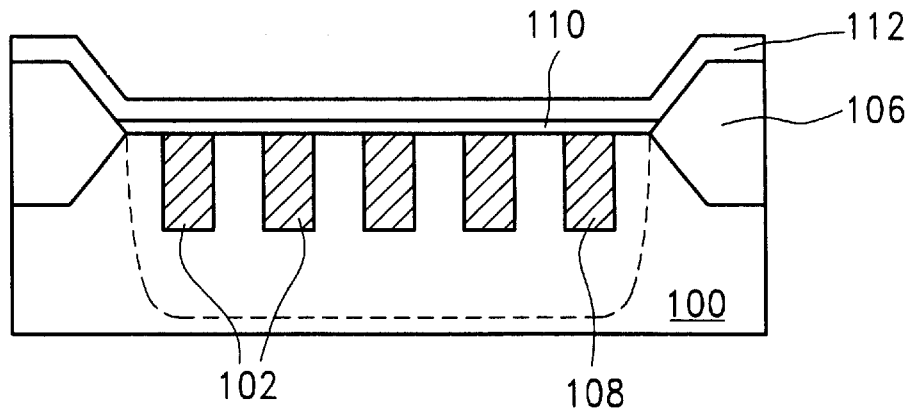
FIG. 1c shows the step of forming an oxide layer and polysilicon layer of the prior art.
Figure 1D:
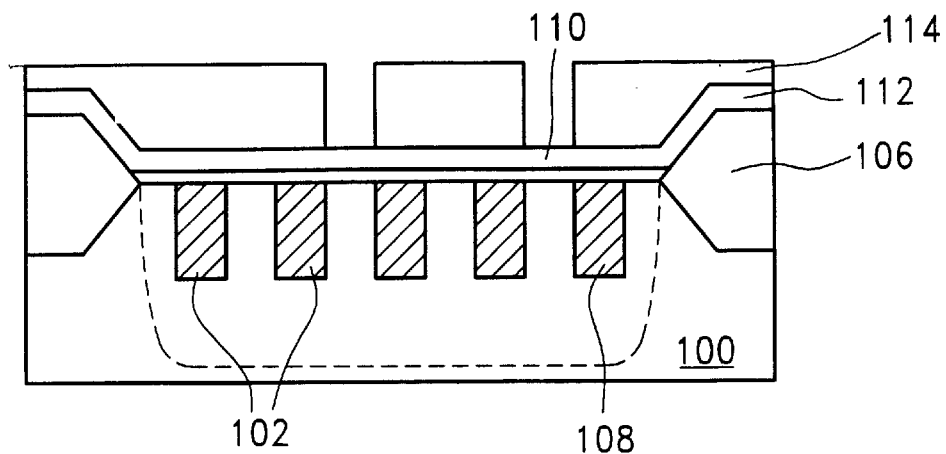
FIG. 1d shows the step of forming a Mask ROM circuit of the prior art.
Figure 1E:
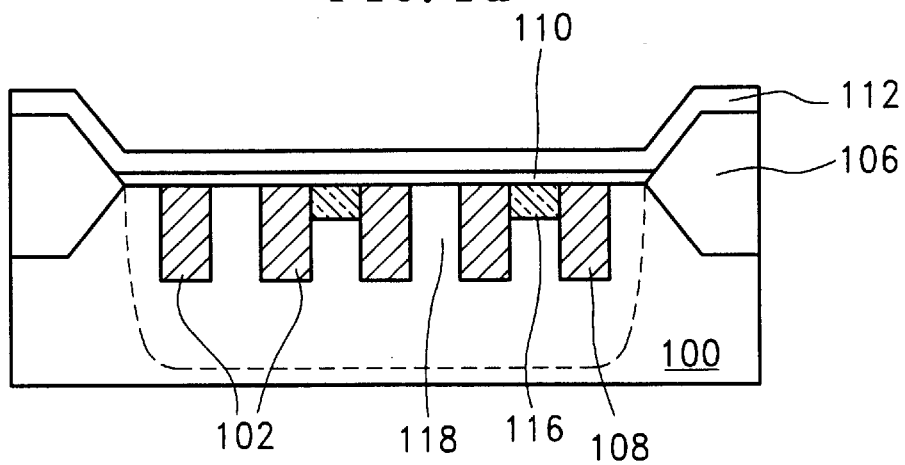
FIG. 1e shows a Mask ROM cell cross section of the prior art.
Figure 2A:
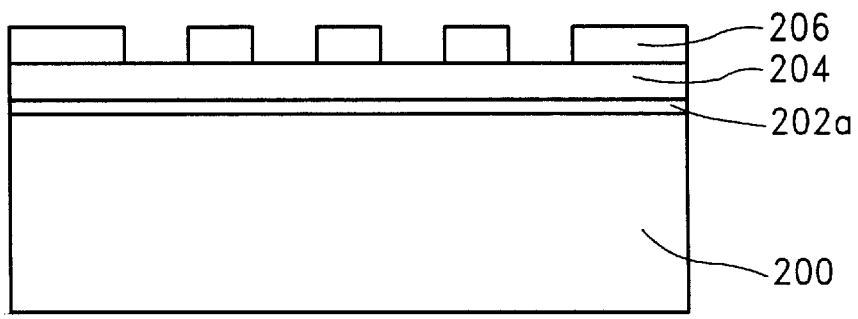
FIG. 2a is a schematic cross-sectional view of a substrate containing a pad oxide layer, a nitride layer and a photo resist.

Referring to FIG. 2a, a silicon substrate 200 is provided for fabricated devices. In the embodiment, the substrate 200 is preferably doped with p-type dopant. A pad oxide layer 202a is formed on the substrate 200. The pad oxide layer 202a is composed of a material such as silicon oxide using thermal oxidization or deposition, etc. In the embodiment, the thickness of the pad oxide layer 202a is about 300 to 600 angstroms. Then, a nitride layer 204 is formed on the pad oxide layer 202a. The first nitride layer 204 is used to protect the pad oxide layer 202a during a later etching step. The first nitride layer 204 has a thickness of about 1,000 to 2,000 angstroms. A photo resist 206 is formed on the first nitride layer 204, wherein the photo resist 206 is used to define regions for etching to form trenches.

Figure 2B:
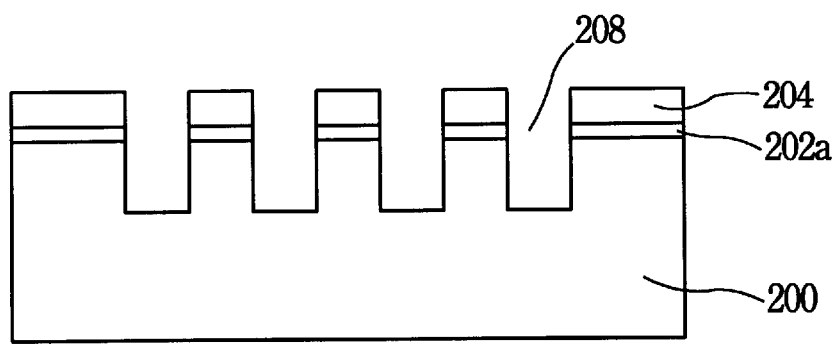
FIG. 2b is a schematic cross-sectional view showing a process for forming plural trenches on the substrate by etching back the nitride layer and the pad oxide layer.

Referring to FIG. 2b, plural trenches 208 are formed on the substrate 200 by well-known etching techniques. In this step, the depth of the trenches can be adjusted using different recipes. That the different depth of the trench 208 causes different threshold voltages between two adjacent doped regions will be described as follows. And, further, the photo resist 206 is removed.

Figure 2C:
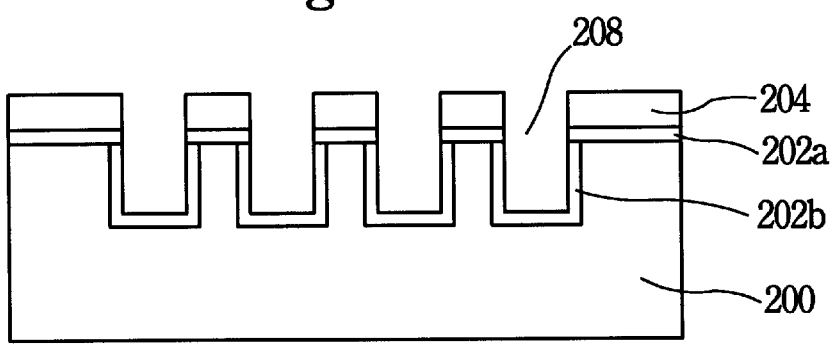
FIG. 2c is a schematic cross-sectional view showing a process for, forming a gate oxide on each trench.
Figure 2D:
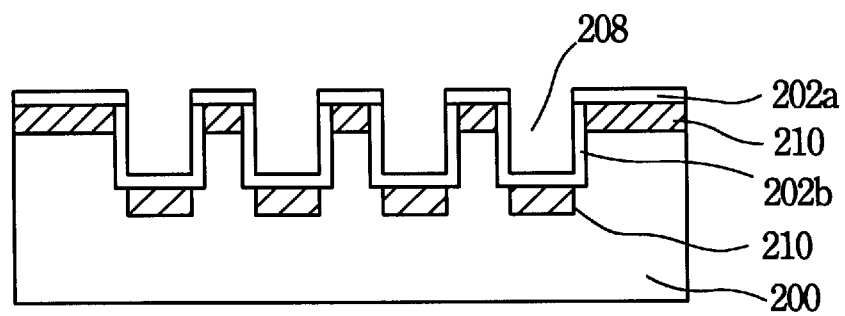
FIG. 2d is a schematic cross-sectional view showing a process for, after the nitride has been removed, implanting As or P ions on substrate beneath gate oxide layer on the bottom of each trench and the pad oxide on the substrate between each trench of the embodiment of the present invention.

Referring to FIG. 2c, a gate oxide layer 202b is formed on the surface of each trench using thermal oxidization. Referring to FIG. 2d, the first nitride layer 204 is removed using phosphate acid ($H_3PO_4$) at temperature of between 150° C to 200° C. After the nitride layer 204 is removed, $n^+$-type ions are doped to form the doped regions 210. The doped regions 210 are formed beneath the gate oxide layer 202b and the pad oxide layer 202b, and on the bottom of each trench and between each of two adjacent trenches. Furthermore, the $n^+$-type ions are arsenic or phosphoric ions, wherein the implanting energy is about 40 KeV to 100 KeV for arsenic ion or 30 KeV to 80 KeV for phosphoric ion. The thickness of n+-type doped regions 210 are about 1,500 to 3,000 angstroms.

Figure 2E:
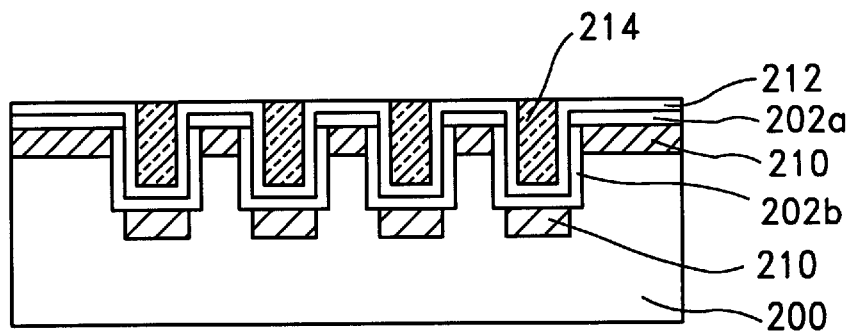
FIG. 2e is a schematic cross-sectional view showing a process for depositing a nitride layer and filling each trench with oxide of the embodiment of the present invention.

Referring to FIG. 2e, using CVD a second nitride layer 212 is formed on the pad oxide layer 202a and the gate oxide layer 202b. After that, HDPCVD (high-density plasma chemical vapor deposition) oxide is used to fill into each trench 208 to form filled-oxide regions 214. Reaction gases at this step contain $SiH_4$, $O_2$ and Ar, otherwise, high-density plasma is used to enhance the reaction rate. After the oxide fills each trench, the surface is smoothed using chemical-mechanical polishing. The step of smoothing the surface is stopped on the surface of the second nitride layer 212 on the pad oxide layer 202a.

Figure 2F:
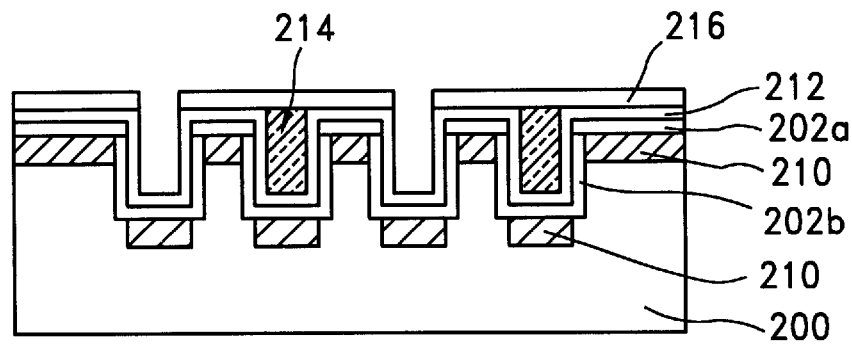
FIG. 2f is a schematic cross-sectional view showing a process for forming a photo resist to define a coding of the Trench Mask ROM and etching some trenches to remove the filled-oxide and the nitride layer of the embodiment of the present invention.

Referring to FIG. 2f, a photo resist 216 is formed on the second nitride layer 212 on the pad oxide and the filled-oxide regions 214 in partial trenches 208. The photo resist 216 covers some trenches 208 to define coding regions. Namely, the photo resist 216 is used to define coding regions of the Trench Mask ROM of the embodiment in the present invention. The exposed filled-oxide regions 214 in the trenches 208 are removed until the gate oxide layer 202b is exposed. The filled-oxide regions 214 and the nitride 212 are removed in each trench, wherein each trench is restricted by using the photo resist 216.

Figure 2G:
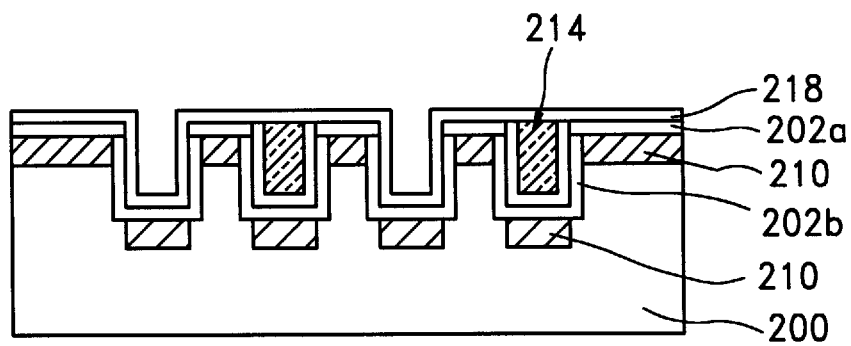
FIG. 2g is a schematic cross-sectional view showing a process for depositing a polysilicon and patterning the polysilicon to form a word line of the embodiment the present invention.

Referring to FIG. 2g, the photo resist 216 is first removed. A polysilicon layer 218 is formed using LPVCD technique at a temperature 450° C. to 650° C. and doped in situ with $n^+$-type dopant. Furthermore, the polysilicon 218 is patterned to form a word line of the Trench Mask ROM of the embodiment of the present invention. Therefore, the Trench Mask ROM of the invention is fabricated.

Figure 3:
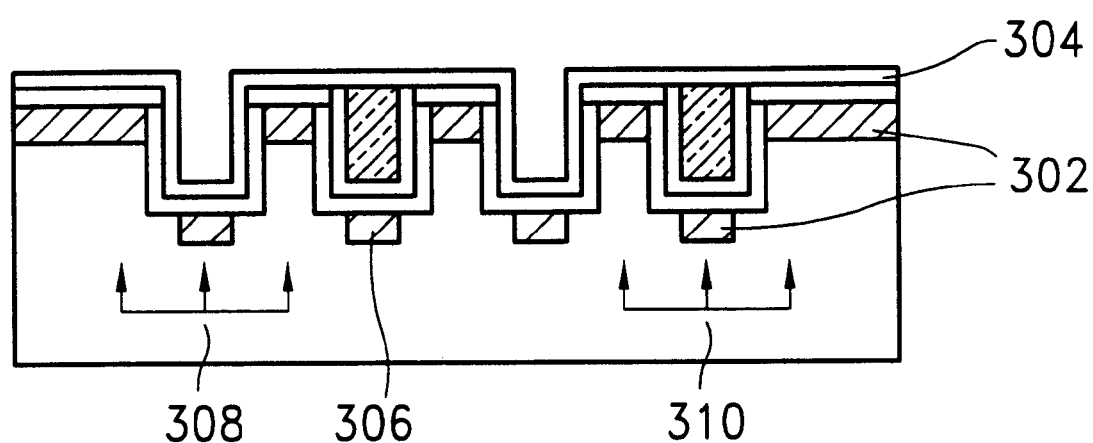
FIG. 3 is a schematic cross-sectional view of the present invention of the Trench Mask ROM.

FIG. 3 is a schematic cross-sectional view of the present invention of the Trench Mask ROM. The Trench Mask ROM comprises bit lines 302, word lines 304, low-logic-level regions 308 and high-logic-level regions 310. The low-logic-level regions 308 are referred to as those regions having low threshold voltage. Conversely, the high-logic-level regions 310 are referred to as those regions having high threshold voltage. The threshold voltage is increased if the depth of the trench becomes deeper. The threshold voltage is also increased if the trench is filled with oxide. The high threshold voltage and the low threshold voltage are respectively either the "off" state and "on" state. Thus, the Trench mask ROM is coded. The low-logic-level regions 308 are equivalent to a device of low threshold Vl and treated as the "on" state. Conversely, the high-logic-level regions 310 are equivalent to a device of high threshold $V_h$ are and treated as the "off" state. The device as 306 is so called an "off device".

As is understood by a person that skilled in the art, the foregoing preferred embodiment of the present invention is illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for fabricating a new type of Trench Mask ROM cell on a substrate, said method comprises the steps as following:

forming plural trenches on said substrate;

forming a gate oxide layer on an outer surface of said substrate;

forming doped regions on said substrate beneath said gate oxide, wherein said doped regions are on bottoms of each said trench and portions between each two adjacent said trench, and said doped region are bit lines of said Trench Mask ROM cell;

forming a nitride layer on said gate oxide layer;

forming oxide layer on said nitride layer and each said trench being filled with said oxide layer;

removing said oxide layer and said nitride layer of partial said trenches, namely, partial said trenches reserving said oxide and nitride to define coding regions of said Trench Mask ROM cell; and depositing a polysilicon layer on top surfaces of said substrate wherein said polysilicon being word line of said Trench Mask ROM cell.

2. The method according to claim 1, wherein said doped regions are doped with $n^+$-type conductive dopants.

3. The method according to claim 2, wherein said $n^+$-type conductive dopant is selected from a group consisting of arsenic and phosphoric ions.

4. The method according to claim 1, further comprises the following, steps before forming plural said trenches on substrate:

forming a pad oxide layer on said substrate; and forming a nitride layer on said pad oxide layer.

5. The method according to claim 1, wherein said gate oxide has a thickness about 80 to 200 angstroms.

6. The method according to claim 1, wherein said nitride layer has a thickness about 50 to 300 angstroms.

7. The method according to claim 1, wherein said doped regions is formed using an ion-implanting step.

8. The method according to claim 7, wherein the energy of said ion-implanting step is about 40 Kev to 100 KeV for arsenic ion.

9. The method according to claim 7, wherein the energy of said ion-implanting step is about 30 Kev to 80 KeV for phosphoric ion.

10. The method according to claim 1, wherein said polysilicon is doped with $n^+$-type conductive ions.

11. A method for fabricating a new type of Trench Mask ROM cell on a substrate, said method comprises the steps as following:

forming a pad oxide layer on said substrate;

forming a first nitride layer on said pad oxide layer forming plural trenches on said substrate by etching back said pad oxide layer, said first nitride layer and said substrate;

forming gate oxide layer on surfaces of each said trench;

removing said first nitride layer;

forming doped regions on said substrate beneath said pad oxide layer and said gate oxide layer, wherein said doped regions are on bottom of each said trench and portion between each two adjacent said trench, and said doped regions being bit lines of said Trench Mask ROM cell;

forming a second nitride layer on said pad oxide layer and gate oxide layer;

forming oxide layer on said nitride layer and each said trench being filled with said oxide layer;

removing said oxide layer and said nitride layer of partial said trenches, namely, partial said trenches reserving said oxide and nitride to define coding regions of said trench Mask ROM cell; and depositing a polysilicon layer on top surfaces of said substrate wherein said polysilicon being word line of said Trench Mask ROM cell.

12. The method according to claim 11, wherein said doped regions is doped with $n^+$-type conductive dopants.

13. The method according to claim 12, wherein said $n^+$-type conductive dopant is selected from a group consisting of arsenic and phosphoric ions.

14. The method according to claim 11, wherein said gate oxide has a thickness about 80 to 200 angstroms.

15. The method according to claim 11, wherein said second nitride layer has a thickness about 50 to 300 angstroms.

16. The method according to claim 11 wherein said doped regions is formed using an ion-implanting step.

17. The method according to claim 16, wherein the energy of said ion-implanting step is about 40 Kev to 100 KeV for arsenic ion.

18. The method according to claim 16, wherein the energy of said ion-implanting step is about 30 Kev to 80 KeV for phosphoric ion.

19. The method according to claim 11, wherein said polysilicon is doped with $n^+$-type conductive ions.

* * * * *